United States Patent
Isobayashi et al.

(10) Patent No.: US 9,209,125 B2
(45) Date of Patent: Dec. 8, 2015

(54) SEMICONDUCTOR DEVICE AND MANUFACTURING METHOD OF THE SAME

(71) Applicant: KABUSHIKI KAISHA TOSHIBA, Minato-ku, Tokyo (JP)

(72) Inventors: Atsunobu Isobayashi, Yokkaichi (JP); Akihiro Kajita, Yokkaichi (JP); Tadashi Sakai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/176,993

(22) Filed: Feb. 10, 2014

(65) Prior Publication Data
US 2015/0061133 A1  Mar. 5, 2015

(30) Foreign Application Priority Data
Aug. 30, 2013  (JP) .................................. 2013-180722

(51) Int. Cl.
| H01L 23/48 | (2006.01) |
| H01L 23/498 | (2006.01) |
| H01L 21/00 | (2006.01) |

(52) U.S. Cl.
CPC .......... *H01L 23/49877* (2013.01); *H01L 21/00* (2013.01); *H01L 2924/0002* (2013.01)

(58) Field of Classification Search
USPC .......... 257/746, 750, 774, E21.577, E21.578, 257/E21.585–E21.588, 760; 438/629
See application file for complete search history.

(56) References Cited

U.S. PATENT DOCUMENTS

| 8,358,008 B2 | 1/2013 | Wada et al. |
| 2011/0006425 A1* | 1/2011 | Wada et al. .................... 257/750 |
| 2012/0080661 A1 | 4/2012 | Saito et al. |
| 2012/0080662 A1 | 4/2012 | Saito et al. |
| 2013/0171781 A1* | 7/2013 | Lee et al. ....................... 438/197 |
| 2014/0084250 A1* | 3/2014 | Wada et al. ...................... 257/29 |

FOREIGN PATENT DOCUMENTS

| JP | 2006-202942 A | 8/2006 |
| JP | 2008-091517 A | 4/2008 |
| JP | 2009-070911 A | 4/2009 |

OTHER PUBLICATIONS

Chuan Xu et al.; "Graphene Nano-Ribbon (GNR) Interconnects: A Genuine Contender or a Delusive Dream?"; University of California, Santa Barbara, CA; 2008; pp. 201-204.

Azad Naeemi et al.; "Performance Benchmarking for Graphene Nanoribbon, Carbon Nanotube, and Cu Interconnects"; Georgia Institute of Technology, Atlanta, GA; 2008; pp. 183-185.

Katsunori Wakabayashi et al.; "Physical Properties of Graphite Sheet—Nano-Graphene—" (and English abstract thereof); 2008; pp. 344-352.

(Continued)

*Primary Examiner* — Jasmine Clark

(74) *Attorney, Agent, or Firm* — Holtz, Holtz, Goodman & Chick PC

(57) ABSTRACT

According to one embodiment, a semiconductor device using a graphene film comprises a catalytic metal layer formed on a groundwork substrate includes a contact via, and a multilayered graphene layer formed in a direction parallel with a surface of the substrate. The catalytic metal layer is formed to be connected to the contact via and covered with an insulation film except one side surface. The multilayered graphene layer is grown from the side surface of the catalytic metal layer which is not covered with the insulation film.

19 Claims, 11 Drawing Sheets

(56) References Cited

OTHER PUBLICATIONS

Wang-Kong Tse et al.; "Ballistic hot electron transport in graphene"; American Institute of Physics; 2008; pp. 023128-1-023128-3.

N Garcia et al.; "Transition from Ohmic to ballistic transport in oriented graphite: Measurements and numerical simulations"; The American Physical Society; 2008; pp. 035413-1-035413-9.

* cited by examiner

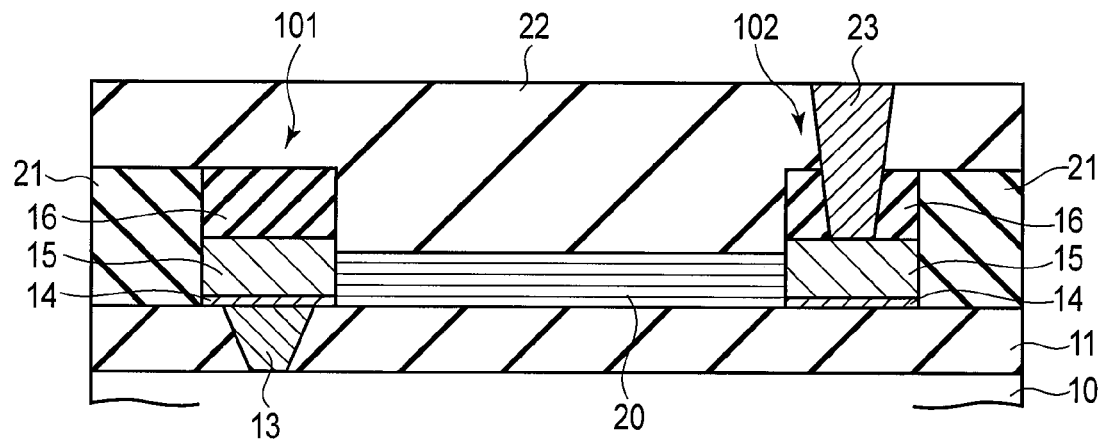
F I G. 1A
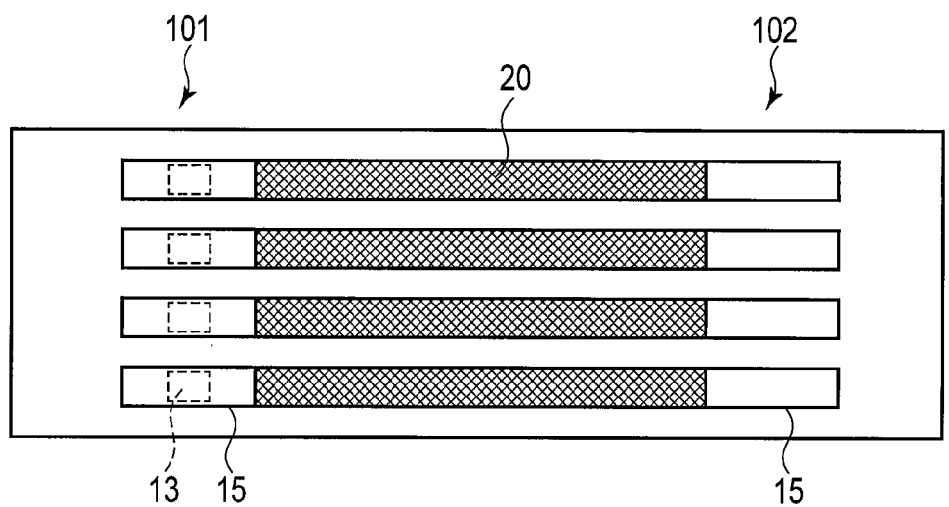
F I G. 1B

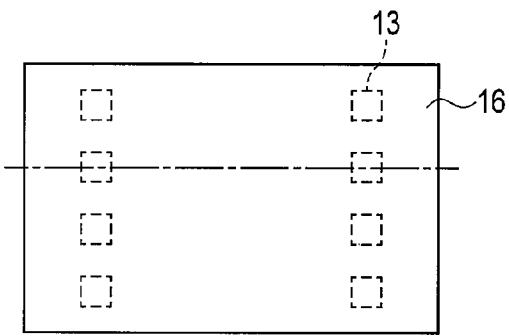 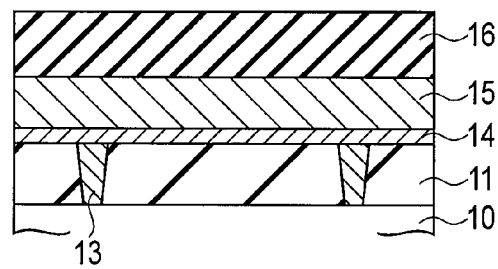
FIG. 2A  FIG. 2B
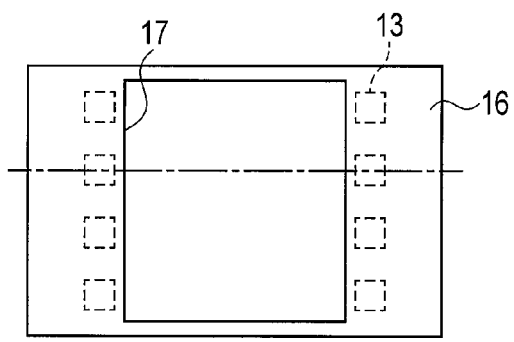 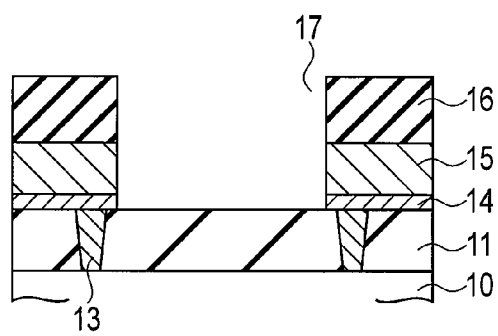
FIG. 3A  FIG. 3B
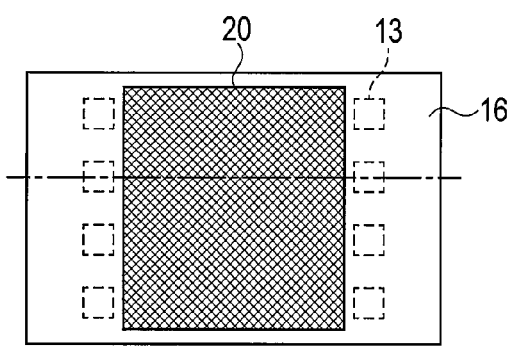 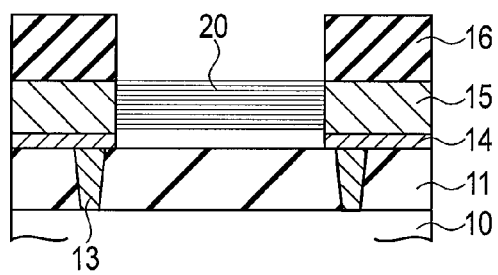
FIG. 4A  FIG. 4B

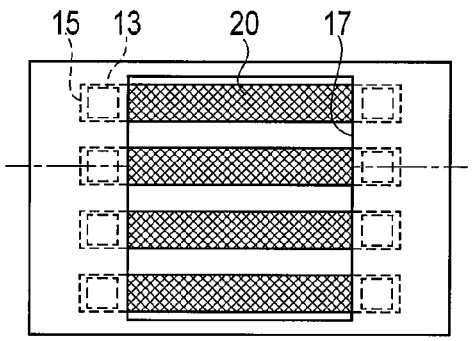 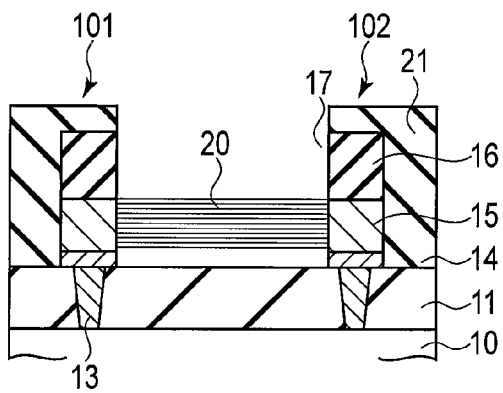
FIG. 5A   FIG. 5B
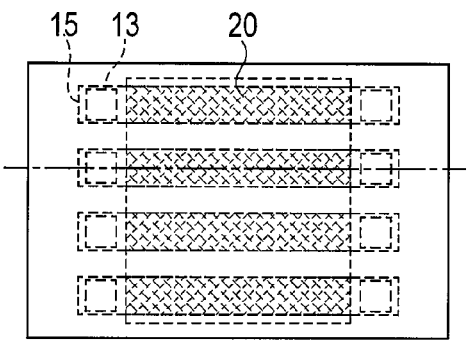 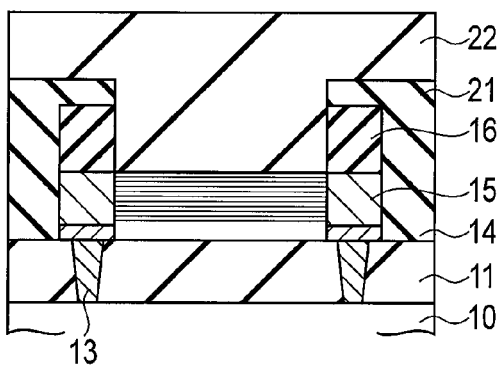
FIG. 6A   FIG. 6B
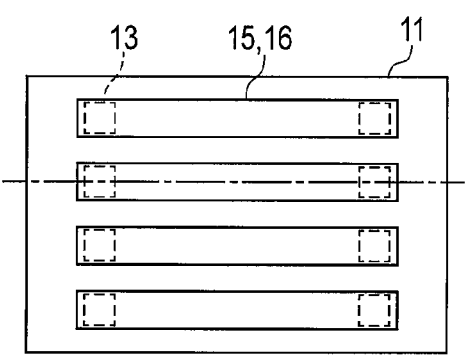 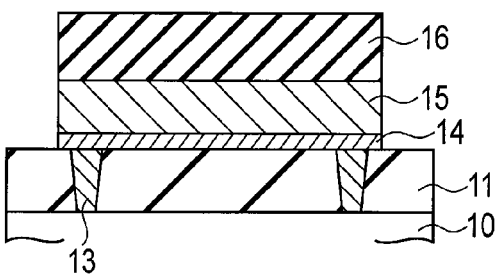
FIG. 7A   FIG. 7B

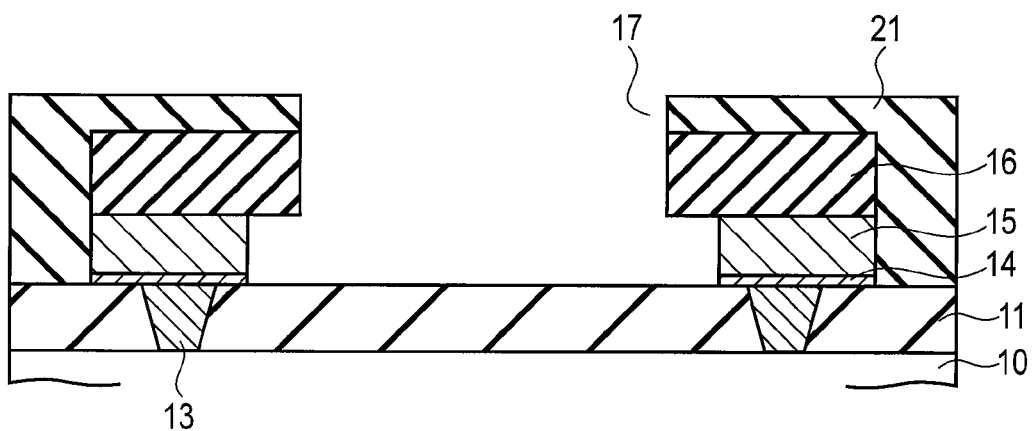
F I G. 10A
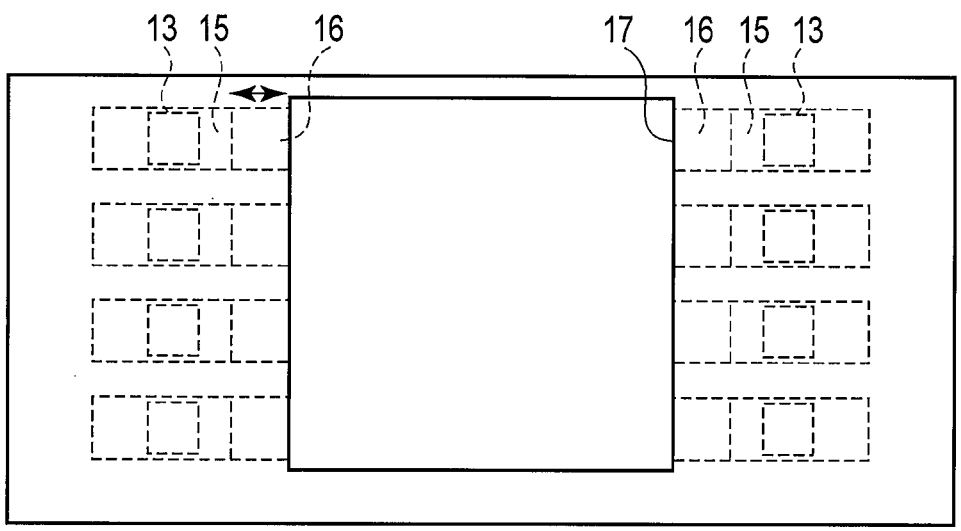
F I G. 10B

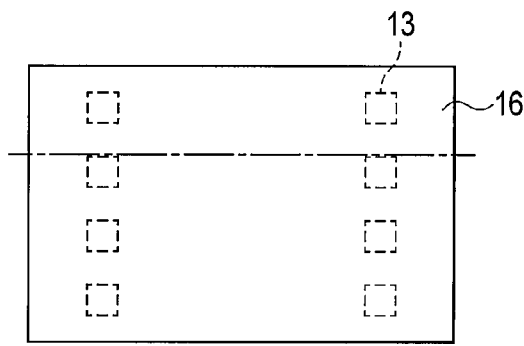 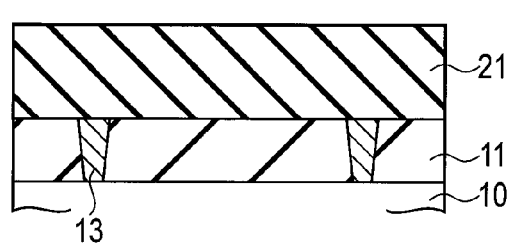
F I G. 12A          F I G. 12B
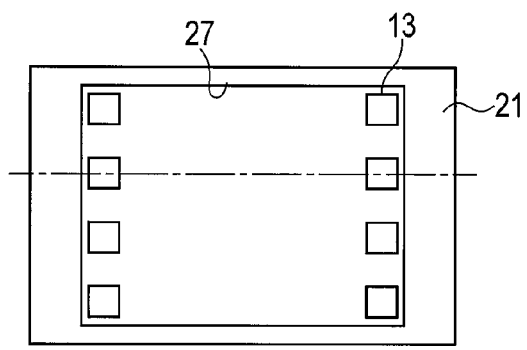 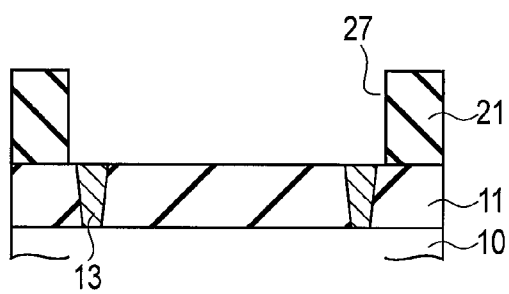
F I G. 13A          F I G. 13B
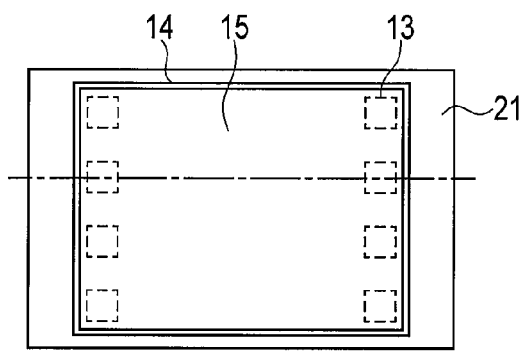 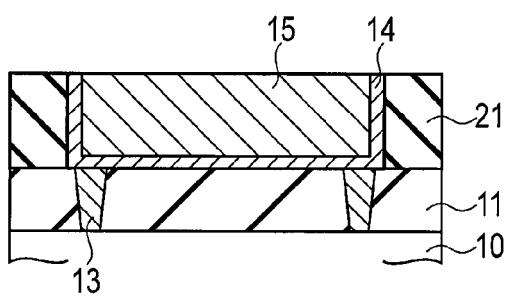
F I G. 14A          F I G. 14B

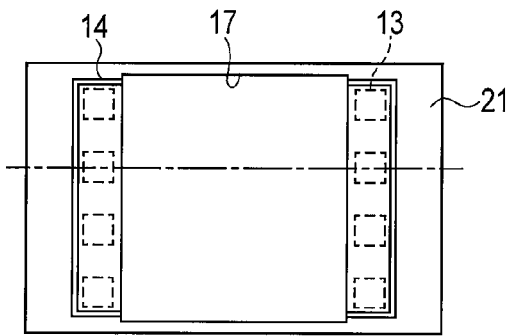
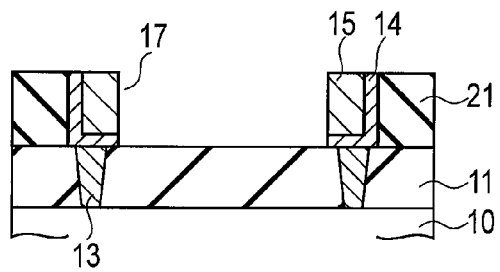
FIG. 15A
FIG. 15B
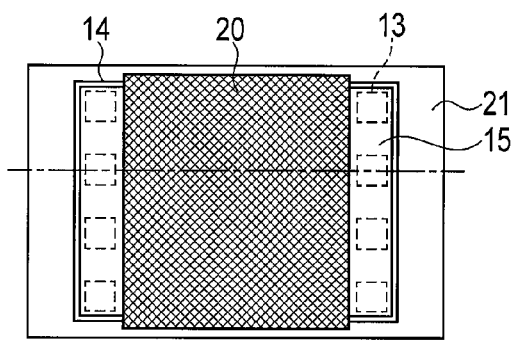
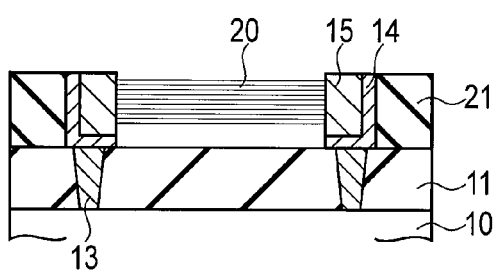
FIG. 16A
FIG. 16B
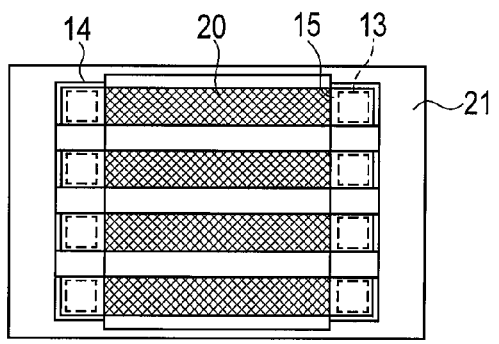
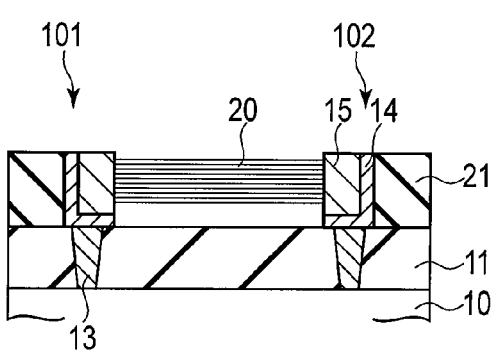
FIG. 17A
FIG. 17B

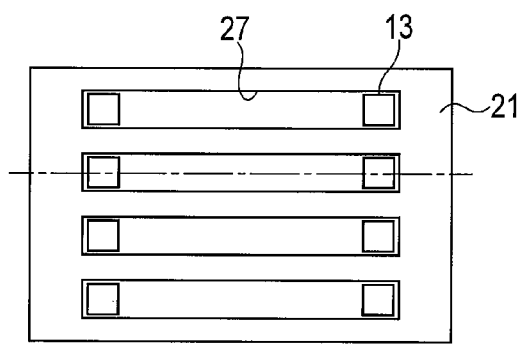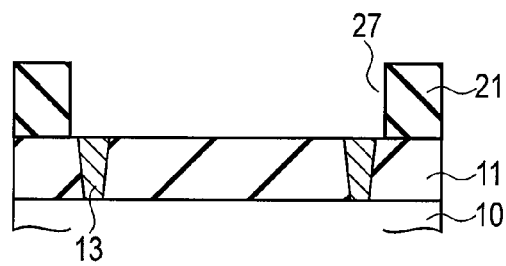
FIG. 18A          FIG. 18B
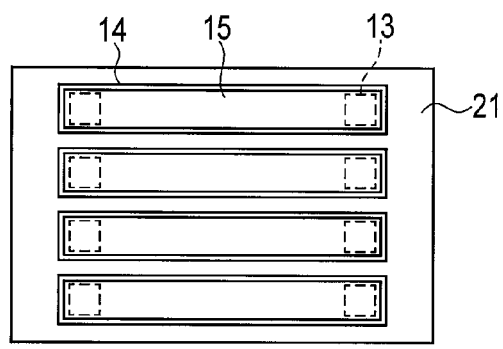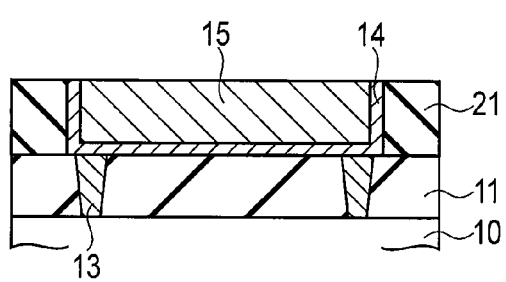
FIG. 19A          FIG. 19B
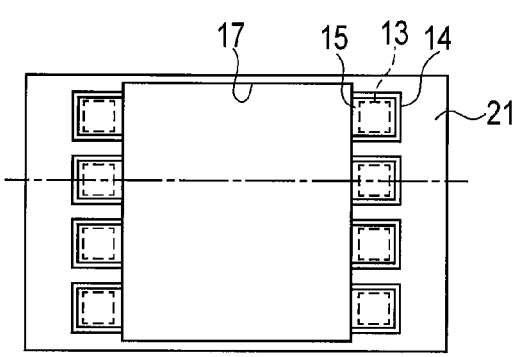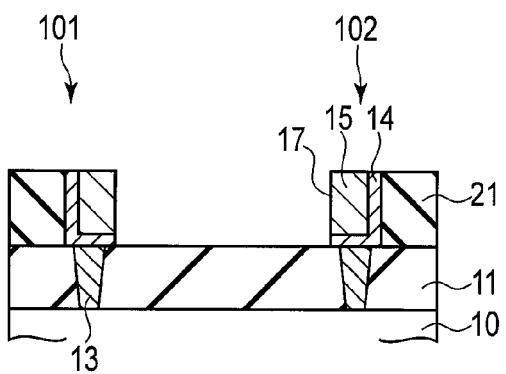
FIG. 20A          FIG. 20B

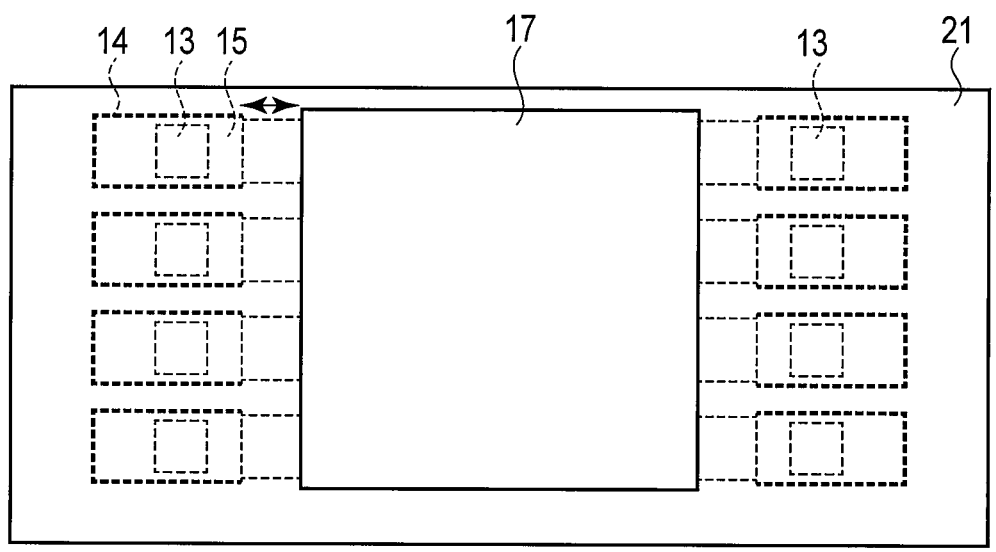
F I G. 21

SEMICONDUCTOR DEVICE AND MANUFACTURING METHOD OF THE SAME

CROSS-REFERENCE TO RELATED APPLICATIONS

This application is based upon and claims the benefit of priority from Japanese Patent Application No. 2013-180722, filed Aug. 30, 2013, the entire contents of which are incorporated herein by reference.

FIELD

Embodiments described herein relate generally to a semiconductor device using a graphene film for a wiring line of LSI and a manufacturing method of the same.

BACKGROUND

Currently, attention has been focused on a graphene wiring structure using graphene instead of metal materials. Graphene is a novel carbon material obtained by extremely thinning graphite and has a quantization conductivity (ballistic conductivity) like a carbon nanotube.

Since graphene performs quantization conduction, graphene can be used as a supreme low-resistance wiring line which can take the place of a metal wiring line. In addition, since ballistic length is long, graphene is advantageous to electric conduction of a long-distance wiring line. Furthermore, since the graphene structure itself is an extremely thin film and can be formed by a CVD method, the structure excellently matches with a device wiring formation process.

BRIEF DESCRIPTION OF THE DRAWINGS

FIGS. 1A and 1B are illustrations showing a schematic structure of a semiconductor device according to a first embodiment;

FIGS. 2A and 2B are illustrations showing a step of manufacturing the semiconductor device according to the first embodiment;

FIGS. 3A and 3B are illustrations showing a step of manufacturing the semiconductor device according to the first embodiment;

FIGS. 4A and 4B are illustrations showing a step of manufacturing the semiconductor device according to the first embodiment;

FIGS. 5A and 5B are illustrations showing a step of manufacturing the semiconductor device according to the first embodiment;

FIGS. 6A and 6B are illustrations showing a step of manufacturing the semiconductor device according to the first embodiment;

FIGS. 7A and 7B are illustrations showing a step of manufacturing a semiconductor device according to a second embodiment;

FIGS. 10A and 10B are illustrations showing a structure of main components of a semiconductor device according to a third embodiment;

FIGS. 12A and 12B are illustrations showing a step of manufacturing the semiconductor device according to the fourth embodiment;

FIGS. 13A and 13B are illustrations showing a step of manufacturing the semiconductor device according to the fourth embodiment;

FIGS. 14A and 14B are illustrations showing a step of manufacturing the semiconductor device according to the fourth embodiment;

FIGS. 15A and 15B are illustrations showing a step of manufacturing the semiconductor device according to the fourth embodiment;

FIGS. 16A and 16B are illustrations showing a step of manufacturing the semiconductor device according to the fourth embodiment;

FIGS. 17A and 17B are illustrations showing a step of manufacturing the semiconductor device according to the fourth embodiment;

FIGS. 18A and 18B are illustrations showing a step of manufacturing a semiconductor device according to a fifth embodiment;

FIGS. 19A and 19B are illustrations showing a step of manufacturing the semiconductor device according to the fifth embodiment;

FIGS. 20A and 20B are illustrations showing a step of manufacturing the semiconductor device according to the fifth embodiment;

FIG. 21 is a plan view showing a structure of main components of a semiconductor device according to a sixth embodiment.

DETAILED DESCRIPTION

Figure 8A:
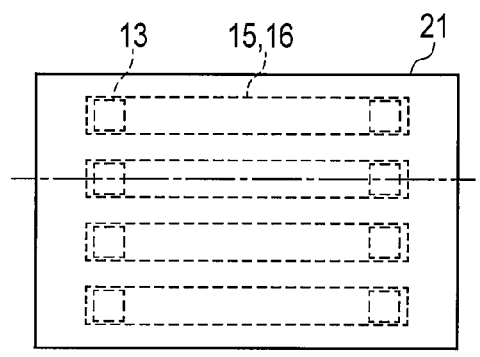
FIGS. 8A and 8B are illustrations showing a step of manufacturing the semiconductor device according to the second embodiment.

In general, according to one embodiment, a semiconductor device using a graphene film comprises a catalytic metal layer formed on a groundwork substrate comprising a contact via, and a multilayered graphene layer formed in a direction parallel with a surface of the substrate. The catalytic metal layer is formed to be connected to the contact via and covered with an insulation film except one side surface. The multilayered graphene layer is grown from the side surface of the catalytic metal layer which is not covered with the insulation film.

Graphene is known to be grown from a facet formed on a catalytic metal by CVD growth within a temperature zone (equal to or lower than 600° C.) used for LSI. Accordingly, graphene may be grown from minute unevenness generated on the catalytic metal as a facet. In the structure in which a multilayered graphene wiring line is formed on a catalytic metal wiring line, small grains of multilayered graphene can be formed by the minute unevenness and resistance can be higher. To reduce the resistance, a multilayered graphene structure in which a grain size is maximized is important.

The present embodiment is characterized by a method of arranging multilayered graphene and a catalytic metal for contributing to maximization of a grain size necessary for reduction of the resistance, in a wiring structure using multilayered graphene, and a method of connecting with a via wiring line when the structure is used as a semiconductor device.

More specifically, if graphene is grown from not a top surface of a catalytic metal layer but a side surface of the catalytic metal layer, graphene is grown in a direction parallel with a substrate surface. In addition, if graphene is grown in a state in which two catalytic metal layers are arranged on the substrate such that exposed side surfaces are opposed to each other, graphene is connected between the two catalytic metal layers.

Hereinafter, semiconductor devices according to embodiments will be described with reference to the accompanying drawings.

First Embodiment

FIGS. 1A and 1B illustrate a schematic structure of a semiconductor device according to a first embodiment. FIG. 1A is a cross-sectional view and FIG. 1B is a plan view. The plan view of FIG. 1B shows only a structure of main components.

In the figures, reference numeral 10 denotes an Si substrate (semiconductor substrate) on which elements such as a transistor and a capacitor, and wiring lines are formed. An interlayer insulation film 11 such as $SiO_2$ is formed on the substrate 10. A contact hole is formed in the insulation film 11, and a contact via 13 to be connected to a lower layer element or a lower layer wiring line is buried in the contact hole.

A first laminated structure 101 is formed on the groundwork substrate on which the insulation film 11 and the contact via 13 are formed. The laminated structure 101 is formed by laminating a barrier layer (barrier metal) 14, a catalytic metal layer 15 and an insulation film 16 which serves as a hard mask such that these layers are connected to the contact via 13. An insulation film 21 is formed on a region except one side surface of the laminated structure 101. A region except one side surface of the catalytic metal layer 15 is thereby covered with the insulation layers 16 and 21.

The barrier layer 14 is an auxiliary film for facilitating formation of graphene, and prevents diffusion of the catalytic metal to the insulation film and a lower layer contact. As a material of the barrier layer 14, Ti, TiN, Ta, TaN or the like, or a nitride thereof can be used.

The catalytic metal layer 15 is a layer necessary for growth of the graphene. As a material of the catalytic metal layer 15, a single-component metal such as Ni, Co, Fe, or Cu, an alloy including at least one of these metals, or a carbide thereof can be used. Furthermore, an impurity such as Ru, Ta, W, Mo or In may be included.

A second laminated structure 102 constituted by the barrier layer 14, the catalytic metal layer 15 and the insulation film 16 is formed on the groundwork substrate, on which the insulation film 11 and the contact via 13 is formed, at a position remote from the first laminated structure 101 in a predetermined distance. Similarly to the catalytic metal layer 15 of the first laminated structure 101, the catalytic metal layer 15 of the second laminated structure 102 also has a region except one side surface covered with the insulation films 16 and 21.

The second laminated structure 102 is not connected to the contact via 13. The catalytic metal layers 15 of the respective first and second laminated structures 101 and 102 are arranged such that the side surfaces which are not covered with the insulation films 16 and 21 are opposed to each other.

A multilayered graphene layer 20 is formed between the respective catalytic metal layers 15 of the first and second laminated structures 101 and 102. More specifically, the multilayered graphene layer 20 made by growing a plurality of graphene layers in a lateral direction is formed between the catalytic metal layer 15 of the first laminated structure 101 having the exposed side surface and the catalytic metal layer 15 of the second laminated structure 102 having the exposed side surface.

An interlayer insulation film 22 is formed on the groundwork substrate on which the laminated structures 101 and 102, the insulation film 21, etc. are formed. A contact via 23 for a connection to an upper layer wiring line is formed to penetrate the interlayer insulation film 22 and the insulation film 16, and to be connected to the catalytic metal layer 15 of the second laminated structure 102.

As shown in FIG. 1B, a plurality of first laminated structures 101 are arranged, and a plurality of second laminated structures 102 are also arranged to correspond to the first laminated structures 101. The multilayered graphene layer 20 is provided between the catalytic metal layers 15 of each of the first laminated structures 101 and each of the second laminated structures 102.

Next, a manufacturing method of the semiconductor device according to the present embodiment will be described with reference to FIGS. 2A and 2B to FIGS. 6A and 6B. In each of the figures, A is a plan view and B is a cross-sectional view. B corresponds to a cross-sectional view of a portion indicated by a one-dot chain line in A. A right contact via is formed on the lower side in FIGS. 2A and 2B to FIGS. 6A and 6B, but, of course, the right contact via may be formed on the upper side.

First, as shown in FIGS. 2A and 2B, the groundwork substrate on which the insulation film 11 and the contact via 13 are formed is prepared on the Si substrate 10. The catalytic metal layer 15 which serves as a catalyst of the growth of the graphene via the barrier layer 14 is deposited on the groundwork substrate, and the insulation film 16 such as $SiO_2$ or SiN which serves as a hard mask is formed on the catalytic metal layer 15. A thickness of the barrier layer 14 is 3-10 nm, a thickness of the catalytic metal layer 15 is 5-30 nm, and a thickness of the insulation film 16 is 10-30 nm. A CVD method may be used for forming a film in each of the layers 14, 15 and 16. As the barrier layer 14, Ti, TiN, Ta, TaN or the like may be used. As the catalytic metal layer 15, Ni, Co, Fe, Cu or the like may be used.

Next, as shown in FIGS. 3A and 3B, the catalytic metal layer 15 and the barrier layer 14 are subjected to selective etching after forming an opening 17 on the insulation film 16. One side surface of the catalytic metal layer 15 is thereby exposed. The opening 17 is formed slightly inside from the left and right contact vias 13 such that the contact vias 13 are not included in the opening 17.

Processing the catalytic metal layer 15 by a mask different from the insulation film 16 in advance is desirable such that the side surface of the catalytic metal layer 15 is not exposed on the side surface on the upper side and the side surface on the lower side of the opening 17 in FIG. 3A.

Next, as shown in FIGS. 4A and 4B, the multilayered graphene layer 20 is grown from the side surface of the catalytic metal layer 15. More specifically, graphene is grown from the side surface of the catalytic metal layer 15 by a plasma CVD method using hydrocarbon gas such as methane or acetylene or mixed gas thereof as a carbon source. Other than hydrocarbon gas, an aromatic having six-membered ring structures or amorphous carbon may be used as source gas. A thermal cracking method may be used instead of the plasma CVD method for growing graphene.

A growth temperature of graphene is approximately 400° C., which is the same as or lower than a temperature in a process of forming wiring lines in a general LSI device. Therefore, graphene has excellent compatibility with a semiconductor process. The multilayered graphene layer 20 is grown from the exposed side surface of the catalytic metal layer 15 and finally connected. That is, a wiring structure in which the processed side surface of the catalytic metal layer 15 and the multilayered graphene layer 20 are connected in series can be obtained.

Next, as shown in FIGS. 5A and 5B, the insulation film 21 is newly formed after removing unnecessary portions of the barrier layer 14, the catalytic metal layer 15 and the insulation film 16. The laminated structures 101 and 102 and the multilayered graphene layer 20 are processed in a wiring pattern by lithography and RIE. The processing of the laminated structures 101 and 102 and the processing of the multilayered graphene layer 20 may be executed at the same time.

Next, as shown in FIGS. 6A and 6B, after depositing the interlayer insulation film 22 of $SiO_2$, etc. in the whole surface, the surface is planarized.

If contact is taken not on the lower side but on the upper side in the second laminated structure 102, the structure shown in FIGS. 1A and 1B can be obtained by forming the contact via 23 on the insulation film 22 and the insulation film 16.

As described above, according to the present embodiment, a graphene wiring line can be formed in a direction parallel with the substrate surface by exposing only one side surface of the catalytic metal layer 15 and growing the multilayered graphene layer 20 from the side surface.

If graphene is grown on the groundwork substrate, resistance can be higher since small grains of multilayered graphene are formed by minute unevenness generated on the ground catalytic metal. In contrast to this, a grain size can be enlarged in the present embodiment since graphene is grown only from the side surface of the catalytic metal layer 15 without being subjected to the influence of the ground. Wiring resistance can thereby be reduced.

Since no physical contact material is present on the top and bottom surfaces of the multilayered graphene layer 20, entry of a molecule in intercalation to be described later can be maximized. Furthermore, since a height of the wiring line can be lower than a height of the catalytic metal layer and the laminated structure of multilayered graphene, there is an advantage that a line capacity can be reduced.

Second Embodiment

FIGS. 7A, 7B to FIGS. 9A, 9B illustrate steps of manufacturing a semiconductor device according to a second embodiment. A is a plan view and B is a cross-sectional view. B corresponds to a cross-sectional view of a portion indicated by a one-dot chain line in A.

A difference of the present embodiment from the above-described first embodiment is that graphene is not subjected to patterning after being formed on a large area, but is grown in accordance with a wiring pattern.

First, similarly to the first embodiment, as shown in FIGS. 2A and 2B, a catalytic metal layer 15 which serves as a catalyst of growth of graphene via a barrier layer 14 is deposited on a groundwork substrate, and an insulation film 16 which serves as a hard mask is formed on the catalytic metal layer 15.

Next, as shown in FIGS. 7A and 7B, after processing the insulation film 16 in the wiring pattern, the catalytic metal layer 15 and the barrier layer 14 are subjected to selective etching to be left in an island shape. More specifically, the pattern formation is executed such that one island includes left and right contact vias 13.

Figure 8B:
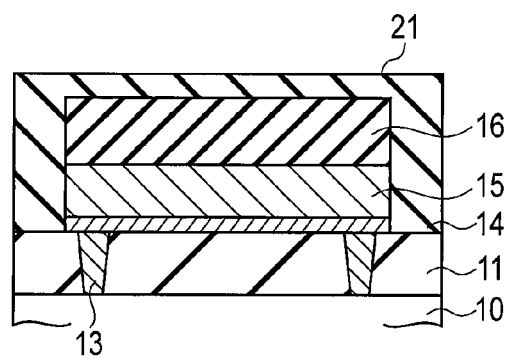

Next, as shown in FIGS. 8A and 8B, an insulation film 21 is deposited in a whole surface to cover the barrier layer 14, the catalytic metal layer 15 and the hard mask 16.

Figure 9A:
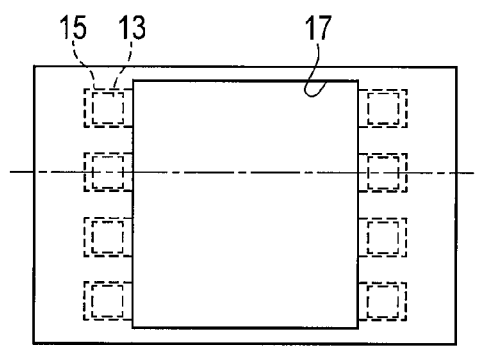
FIGS. 9A and 9B are illustrations showing a step of manufacturing the semiconductor device according to the second embodiment.
Figure 9B:
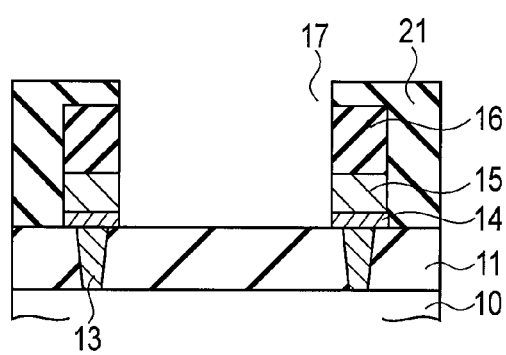

Next, as shown in FIGS. 9A and 9B, one side surface of the catalytic metal layer 15 is exposed by forming an opening 17 in the insulating film 21, the insulating film 16, the catalytic metal layer 15 and the barrier layer 14 by lithography and RIE. The opening 17 is formed slightly inside from the left and right contact vias 13 such that the contact vias 13 are not included in the opening 17.

Next, a multilayered graphene layer 20 is grown from the exposed side surface of the catalytic metal layer 15. The multilayered graphene layer 20 is grown from the left and right catalytic metal layers 15 and finally connected. That is, similarly to FIGS. 5A and 5B, a wiring structure in which the processed side surface of the catalytic metal layer 15 and the multilayered graphene layer 20 are connected in series can be obtained. In addition, since the catalytic metal layer 15 is processed in the wiring pattern in advance, the multilayered graphene layer 20 is also formed to be divided into a plurality of layers.

Next, similarly to FIGS. 6A and 6B, after depositing an interlayer insulation film 22 in the whole surface, a contact via 23 is formed on a side of the upper layer, if necessary.

Even by such a method, a graphene wiring line can be formed in a direction parallel with the substrate surface by exposing only one side surface of the catalytic metal layer 15 and growing the multilayered graphene layer 20 from the side surface, similarly to the above-described first embodiment. Therefore, the same advantage as the first embodiment can be achieved. In addition, the embodiment has a benefit that since graphene does not need to be processed, damage to a side wall end of graphene is suppressed and crystallinity can be thereby kept as it has been at the time of the growth.

Third Embodiment

FIGS. 10A and 10B illustrate a structure of main components of a semiconductor device according to a third embodiment. A is a cross-sectional view and B is a plan view.

In the present embodiment, one side surface of a catalytic metal layer 15 is formed behind a side surface of an insulation film 16 to improve rectilinearity of growth of graphene.

In the step shown in FIGS. 9A and 9B of the above-described second embodiment, the side surface of the catalytic metal layer 15 is formed behind the side surface of the insulation film 16 by recessing the catalytic metal layer 15 and a barrier layer 14 as shown in FIGS. 10A and 10B. The recess is subjected to heat treatment at 400-600° C. using a gas such as $CH_4$, $C_2H_4$ or $C_2H_2$.

If graphene is grown in such a state, rectilinearity of the growth of graphene from the side surface of the catalytic metal layer 15 can be improved since the diffusion of graphene to a vertical direction and a longitudinal direction is suppressed. Therefore, not only can the same advantage as the second embodiment be achieved, but the left and right catalytic metal layers 15 can also be connected more reliably through the multilayered graphene layer 20 and reliability of the graphene wiring line can thereby be improved.

Fourth Embodiment

Figure 11A:
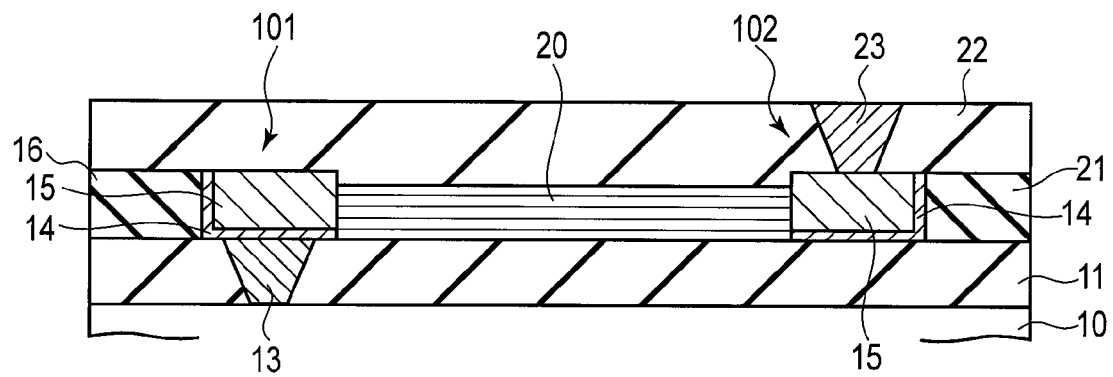
FIGS. 11A and 11B are illustrations showing a schematic structure of a semiconductor device according to a fourth embodiment.
Figure 11B:
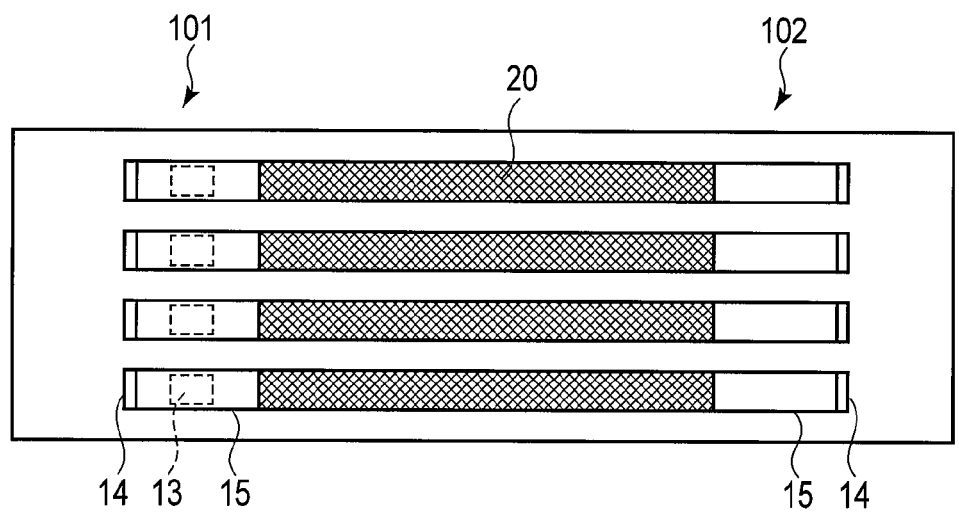

FIGS. 11A and 11B illustrate a schematic structure of a semiconductor device according to a fourth embodiment. A is a cross-sectional view and B is a plan view. The plan view of FIG. 11B shows only a structure of main components.

The basic structure is the same as FIGS. 1A and 1B of the first embodiment. In the present embodiment, a barrier layer 14 is formed not only on a bottom surface of a catalytic metal layer 15, but also on one side surface of the catalytic metal layer 15. That is, the barrier layer 14 is formed on the side surface opposite to an exposed side surface of the catalytic metal layer 15. Except for the above components, the structure is the same as FIGS. 1A and 1B.

Next, a manufacturing method of the semiconductor device according to the present embodiment will be described with reference to FIGS. 12A and 12B to FIGS. 17A and 17B. In each of the figures, A is a plan view and B is a cross-sectional view. B corresponds to a cross-sectional view of a portion indicated by a one-dot chain line in A. A right contact via is formed on the lower side in FIGS. 12A and 12B to FIGS. 17A and 17B, but, of course, the right contact via may be formed on the upper side.

First, as shown in FIGS. 12A and 12B, an insulation film 21 is formed on a groundwork substrate, which is an Si substrate on which an insulation film 11 and a contact via 13 are formed.

Next, as shown in FIGS. 13A and 13B, an opening 27 is formed on the insulation film 21 so as to include left and right contact vias 13.

Next, as shown in FIGS. 14A and 14B, the barrier layer 14 is formed on the bottom and the side surface of the opening 27, and the catalytic metal layer 15 is further formed to fill the opening 27. More specifically, after depositing the catalytic metal layer 15 by a CVD method etc., the catalytic metal layer may be planarized by CMP, similarly to damascene interconnect technology.

Next, as shown in FIGS. 15A and 15B, an opening 17 is formed and one side surface of the catalytic metal layer 15 is exposed by processing the catalytic metal layer 15 and the barrier layer 14 by lithography, RIE and wet processing. The opening 17 is formed slightly inside from the left and right contact vias 13 such that the contact vias 13 are not included in the opening 17.

Next, as shown in FIGS. 16A and 16B, a multilayered graphene layer 20 is grown from the side surface of the catalytic metal layer 15. A method of growing the multilayered graphene layer 20 may be the same as the method of the first embodiment.

Next, as shown in FIGS. 17A and 17B, the multilayered graphene layer 20 is processed in a wiring pattern together with the barrier layer 14 and the catalytic metal layer 15 by lithography, RIE and wet processing. A pattern of a first laminated structure 101 on a left side and a second laminated structure 102 on a right side is thereby formed.

After this, the semiconductor device according to the present embodiment is completed by depositing an interlayer insulation film 22 such as $SiO_2$ in a whole surface and planarizing the surface. If contact is taken not on the lower side but on the upper side of the second laminated structure 102, the structure shown in FIGS. 11A and 11B can be obtained by forming the contact via 23 on the insulation film 22 and the insulation film 16.

As described above, according to the present embodiment, a graphene wiring line can be formed in a direction parallel with the substrate surface by exposing only one side surface of the catalytic metal layer 15 and growing the multilayered graphene layer 20 from the side surface. Therefore, the same advantage as the first embodiment can be achieved. In addition, the embodiment has a benefit that deterioration of the catalytic metal layer 15 such as oxidation from an interface with the insulation film 21 is suppressed by the existence of the barrier layer 14, and the catalytic metal layer 15 can thereby have the property as a catalyst of the growth of graphene more reliably.

Fifth Embodiment

FIGS. 18A, 18B to FIGS. 20A, 20B illustrate steps of manufacturing a semiconductor device according to a fifth embodiment.

First, similarly to the fourth embodiment, an insulation film 21 is formed on a groundwork substrate as shown in FIGS. 12A and 12B.

Next, as shown in FIGS. 18A and 18B, an opening 27 is formed on the insulation film 21 in accordance with a wiring pattern to be formed. The opening 27 is not formed to include all of the left and right contact vias 13, but a plurality of openings 27 are formed such that each of the openings 27 includes a pair of the left and right contact vias.

Next, as shown in FIGS. 19A and 19B, a catalytic metal layer 15 is buried in each of the openings 27 via a barrier layer 14.

Next, as shown in FIGS. 20A and 20B, an opening 17 is formed between the left and right contact vias 13 and one side surface of the catalytic metal layer 15 is exposed by executing selective etching for the insulation film 21 together with the catalytic metal layer 15 and the barrier layer 14. The opening 17 is formed slightly inside from the left and right contact vias 13 such that the contact vias 13 are not included in the opening 17. A pattern of first laminated structure 101 on a left side and a second laminated structure 102 on a right side is thereby formed.

Next, a multilayered graphene layer 20 is grown from the exposed side surface of the catalytic metal layer 15. Since the catalytic metal layer 15 is processed in the wiring pattern in advance, the multilayered graphene layer 20 is also formed to be divided into a plurality of layers. The same structure as FIGS. 17A and 17B can thereby be obtained.

Next, after depositing an interlayer insulation film 22 in the whole surface, a contact via 23 is formed on a side of the upper layer, if necessary.

Even by such a method, a graphene wiring line can be formed in a direction parallel with the substrate surface by exposing only one side surface of the catalytic metal layer 15 and growing the multilayered graphene layer 20 from the side surface, similarly to the above-described fourth embodiment. Therefore, the same advantage as the fourth embodiment can be achieved.

Sixth Embodiment

FIG. 21 is a plan view showing a structure of main components of a semiconductor device according to a sixth embodiment.

In the present embodiment, one side surface of a catalytic metal layer 15 is formed behind a side surface of an insulation film 21 to improve rectilinearity of growth of graphene.

After the step shown in FIGS. 20A and 20B in the above-described fifth embodiment, the side surface of the catalytic metal layer 15 is formed behind the side surface of the insulation film 21 by recessing the catalytic metal layer 15 and a barrier layer 14 as shown in FIG. 21. The recess is subjected to heat treatment at 400-600° C. using a gas such as $CH_4$, $C_2H_4$ or $C_2H_2$.

If graphene is grown in the above state, a growth direction of graphene from the side surface of the catalytic metal layer 15 is defined and the rectilinearity of the growth of graphene can be improved. Therefore, not only can the same advantage as the fifth embodiment be achieved, but reliability of a graphene wiring line can also be improved.

Seventh Embodiment

Figure 22A:
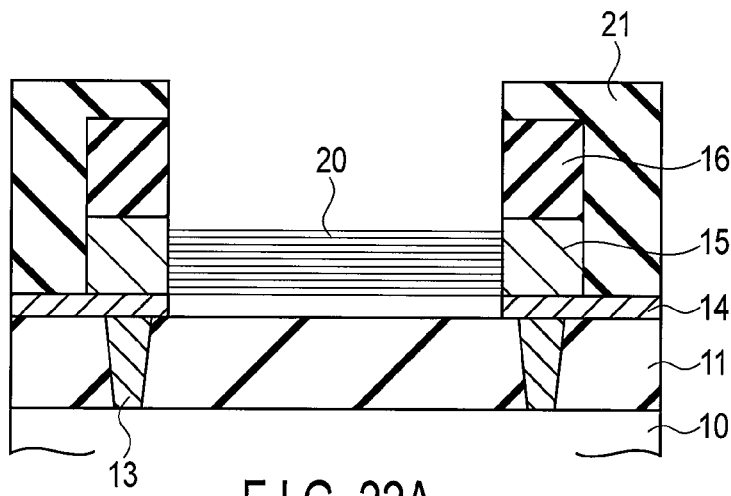
FIGS. 22A to 22C are cross-sectional views showing steps of manufacturing a semiconductor device according to a seventh embodiment.
Figure 22B:
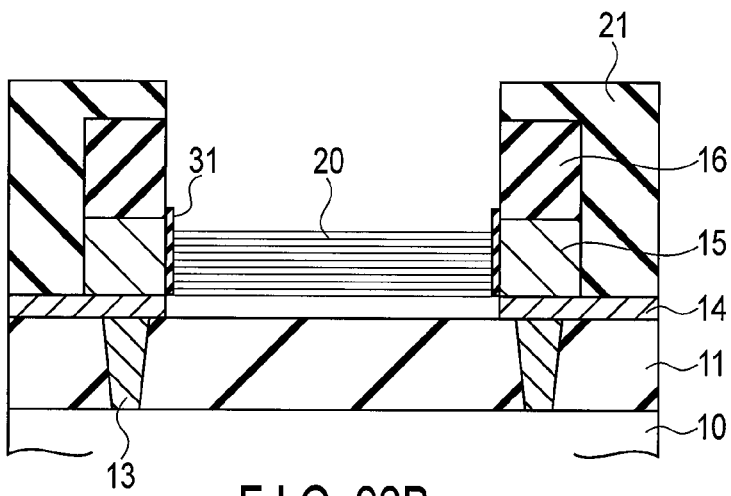
Figure 22C:
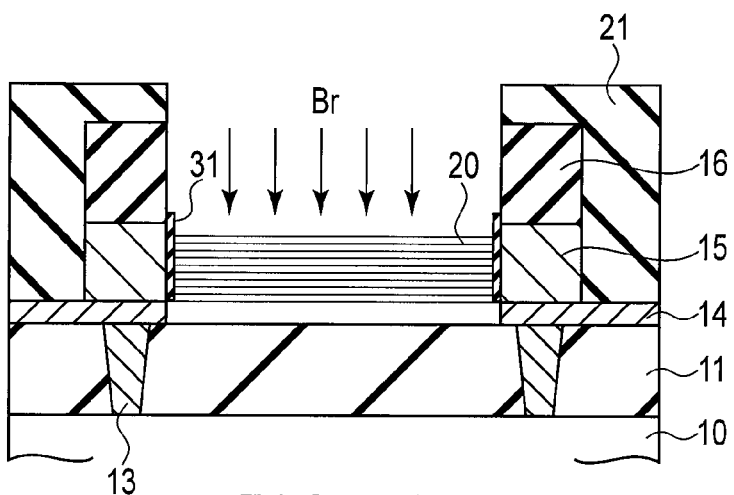

FIG. 22A to FIG. 22C are cross-section views showing steps of manufacturing a semiconductor device according to a seventh embodiment.

In the present embodiment, a measure against corrosion of a catalytic metal in an intercalation process using halogen gas is taken.

Resistance of graphene is proved to be reduced when graphene is doped with halogen such as Cl or Br. However, if such processing is executed in a state in which a catalytic metal layer is exposed, the catalytic metal layer may be corroded.

Thus, in the present embodiment, a protective film of W, W—Ni, W—Fe, CoWp (B), Cr, Mn, Pt, Au or the like is formed on the exposed side surface of the catalytic metal layer by non-electrolytic plating, CVD selective growth etc. after growing a graphene layer and connecting between two electrodes.

Similarly to FIG. 5B, FIG. 22A shows a state in which laminated structures 101 and 102 and a multilayered graphene layer 20 are processed in a wiring pattern. With respect to a sample in the above state, the protective film 31 of W or the like is formed on the exposed side surface of the catalytic metal layer 15 by, for example, a selective CVD method as shown in FIG. 22B. Incidentally, the protective film 31 can also be formed on a side surface of a barrier layer 14 depending on a material of the barrier layer 14, but no problem occurs if the protective film 31 is formed on the side surface of the barrier layer 14.

Next, the multilayered graphene layer 20 is doped with halogen such as Br as shown in FIG. 22C. Since the side surface of the catalytic metal layer 15 is covered with the protective film 31, corrosion of the side surface of the catalytic metal layer 15 can be prevented.

That is, if the intercalation processing is executed after the formation of the protective film 31, corrosion of the side surface of the catalytic metal layer 15 can be prevented since the side surface of the catalytic metal layer 15 is protected without being exposed.

Therefore, resistance of the multilayered graphene layer can be further reduced and reliability as a wiring line can be improved.

Modified Embodiments

The present invention is not limited to each of the above-described embodiments.

Although two catalytic metal layers are formed on a groundwork substrate to be opposed to each other and a multilayered graphene layer is formed therebetween in the embodiments, the catalytic metal layers do not necessarily need to be opposed to each other. For example, the multilayered graphene layer can be grown from one catalytic metal layer in a direction parallel with a substrate surface.

In addition, although a barrier metal is formed on a ground of the catalytic metal layer in the embodiments, the barrier metal can be omitted if diffusion from the catalytic metal layer 15 to a lower layer contact does not become a problem.

Furthermore, an element used for doping the graphene layer is not necessarily limited to halogen such as Br, Cl or the like, but N can also be used. Moreover, the graphene layer may be doped with these multiple types of elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a catalytic metal layer formed on a groundwork substrate comprising a contact via, the catalytic metal layer being formed to be connected to the contact via and covered with an insulation film except one side surface; and
   a multilayered graphene layer formed in a direction parallel with a surface of the substrate, the multilayered graphene layer being grown from the side surface of the catalytic metal layer which is not covered with the insulation film.

2. The device according to claim 1, wherein the groundwork substrate comprises a semiconductor substrate, an interlayer insulation film formed on the semiconductor substrate and the contact via buried in the interlayer insulation film.

3. The device according to claim 1, further comprising a barrier metal between the catalytic metal layer and the contact via, wherein a bottom surface of the multilayered graphene layer is in no contact with the substrate.

4. The device according to claim 1, wherein the side surface of the catalytic metal layer which is not covered with the insulation film is formed behind a side surface of the insulation film.

5. The device according to claim 3, wherein the barrier metal is formed on another side surface other than the side surface of the catalytic metal layer which is not covered with the insulation film.

6. The device according to claim 5, wherein the side surface of the catalytic metal layer which is not covered with the insulation film is formed behind a side surface of the insulation film.

7. The device according to claim 1, wherein a metal film or a metal-oxide film for preventing corrosion of the catalytic metal layer is formed on the side surface of the catalytic metal layer which is not covered with the insulation film, and the multilayered graphene layer is doped with Br, Cl or C.

8. A semiconductor device comprising:
   a first catalytic metal layer formed on a groundwork substrate comprising a contact via, the first catalytic metal layer being formed to be connected to the contact via and covered with an insulation film except one side surface;
   a second catalytic metal layer formed on the substrate, the second catalytic metal layer being covered with the insulation film except one side surface and provided such that the one side surface is opposed to the one side surface of the first catalytic metal layer; and
   a multilayered graphene layer formed in a direction parallel with a surface of the substrate to connect between the first and second catalytic metal layers, the multilayered graphene layer being grown from each of the side surfaces of the first and second catalytic metal layers which are not covered with the insulation film.

9. The device according to claim 8, wherein the groundwork substrate comprises a semiconductor substrate, an interlayer insulation film formed on the semiconductor substrate and the contact via buried in the interlayer insulation film.

10. The device according to claim 8, wherein a bottom surface or a top surface of the second catalytic metal layer is connected to a contact via different from the contact via.

11. The device according to claim 8, further comprising barrier metals between the first catalytic metal layer and the contact via, and between the second catalytic metal layer and the substrate, respectively, wherein a bottom surface of the multilayered graphene layer is in no contact with the substrate.

12. The device according to claim 8, wherein the side surface of the first catalytic metal layer which is not covered with the insulation film is formed behind a first side surface of the insulation film, and wherein the side surface of the second catalytic metal layer which is not covered with the insulation film is formed behind a second side surface of the insulation film.

13. The device according to claim 11, wherein the barrier metals are also formed on other side surfaces of the first and second catalytic metal layers other than the side surfaces of the first and second catalytic metal layers which are not covered with the insulation film.

14. The device according to claim 13, wherein the side surface of the first catalytic metal layer which is not covered with the insulation film is formed behind a first side surface of the insulation film, and wherein the side surface of the second catalytic metal layer which is not covered with the insulation film is formed behind a second side surface of the insulation film.

15. The device according to claim 8, wherein a metal film or a metal-oxide film for preventing corrosion of the first catalytic metal layer is formed on the side surface of the first catalytic metal layer which is not covered with the insulation film, wherein a metal film or a metal-oxide film for preventing corrosion of the second catalytic metal layer is formed on the side surface of the second catalytic metal layer which is not covered with the insulation film, and wherein the multilayered graphene layer is doped with Br, Cl or C.

16. A method of manufacturing a semiconductor device, comprising:

forming a catalytic metal layer to be connected to a contact via on a groundwork substrate comprising the contact via;

covering a region of the catalytic metal layer with an insulation film except one side surface; and growing a multilayered graphene layer from the side surface of the catalytic metal layer which is not covered with the insulation film, in a direction parallel with a surface of the substrate.

17. The method according to claim 16, wherein the groundwork substrate is formed by depositing an interlayer insulation film on a semiconductor substrate, and burying the contact via in the interlayer insulation film.

18. The method according to claim 16, further comprising:

forming a metal film or a metal-oxide film for preventing corrosion on the side surface of the catalytic metal layer which is not covered with the insulation film, after forming the multilayered graphene layer.

19. The method according to claim 16, further comprising:

doping the graphene layer with Br, Cl or C after forming a metal film or a metal-oxide film for preventing corrosion on the side surface of the catalytic metal layer which is not covered with the insulation film.

* * * * *